(12) United States Patent
Guilford et al.

(10) Patent No.: US 10,158,376 B2
(45) Date of Patent: Dec. 18, 2018

(54) TECHNIQUES TO ACCELERATE LOSSLESS COMPRESSION

(71) Applicant: INTEL CORPORATION, Santa Clara, CA (US)

(72) Inventors: James D. Guilford, Northborough, MA (US); Vinodh Gopal, Westborough, MA (US); Gilbert M. Wolrich, Framingham, MA (US); Erdinc Ozturk, Marlborough, MA (US); Wajdi K. Feghali, Boston, MA (US)

(73) Assignee: INTEL CORPORATION, Santa Clara, CA (US)

( * ) Notice: Subject to any disclaimer, the term of this patent is extended or adjusted under 35 U.S.C. 154(b) by 338 days.

(21) Appl. No.: 15/053,921

(22) Filed: Feb. 25, 2016

(65) Prior Publication Data

US 2016/0173126 A1 Jun. 16, 2016

Related U.S. Application Data

(62) Division of application No. 13/538,826, filed on Jun. 29, 2012, now abandoned.

(51) Int. Cl.
*H03M 7/00* (2006.01)
*H03M 7/30* (2006.01)
*G06F 9/30* (2018.01)

(52) U.S. Cl.
CPC .......... *H03M 7/60* (2013.01); *G06F 9/30029* (2013.01); *H03M 7/3068* (2013.01); *H03M 7/6058* (2013.01)

(58) Field of Classification Search
CPC .. H03M 7/60; H03M 7/30029; H03M 7/6058; H03M 7/30; G06F 9/30029; G06F 9/30
USPC ....................................................... 341/50, 51
See application file for complete search history.

(56) References Cited

U.S. PATENT DOCUMENTS

| | | | |
|---|---|---|---|
| 7,180,433 B1* | 2/2007 | Grotmol | H03M 7/3086 341/50 |
| 7,725,699 B2* | 5/2010 | Gorman | G06F 7/76 712/300 |
| 7,797,612 B2* | 9/2010 | Gopal | G06F 11/1076 714/770 |

* cited by examiner

*Primary Examiner* — Jean B Jeanglaude

(57) ABSTRACT

An embodiment may include circuitry that may be capable of performing compression-related operations that may include: (a) indicating, at least in part, in a data structure at least one position of at least one subset of characters that are to be encoded as a symbol, (b) comparing, at least in part, at least one pair of multi-byte data words that are of identical predetermined fixed size, (c) maintaining, at least in part, an array of pointers to potentially matching strings that are to be compared with at least one currently examined string, and/or (d) allocating, at least in part, a first buffer portion to store at least one portion of uncompressed data from an application buffer that is to be input for compression to produce a compressed data stream.

24 Claims, 7 Drawing Sheets

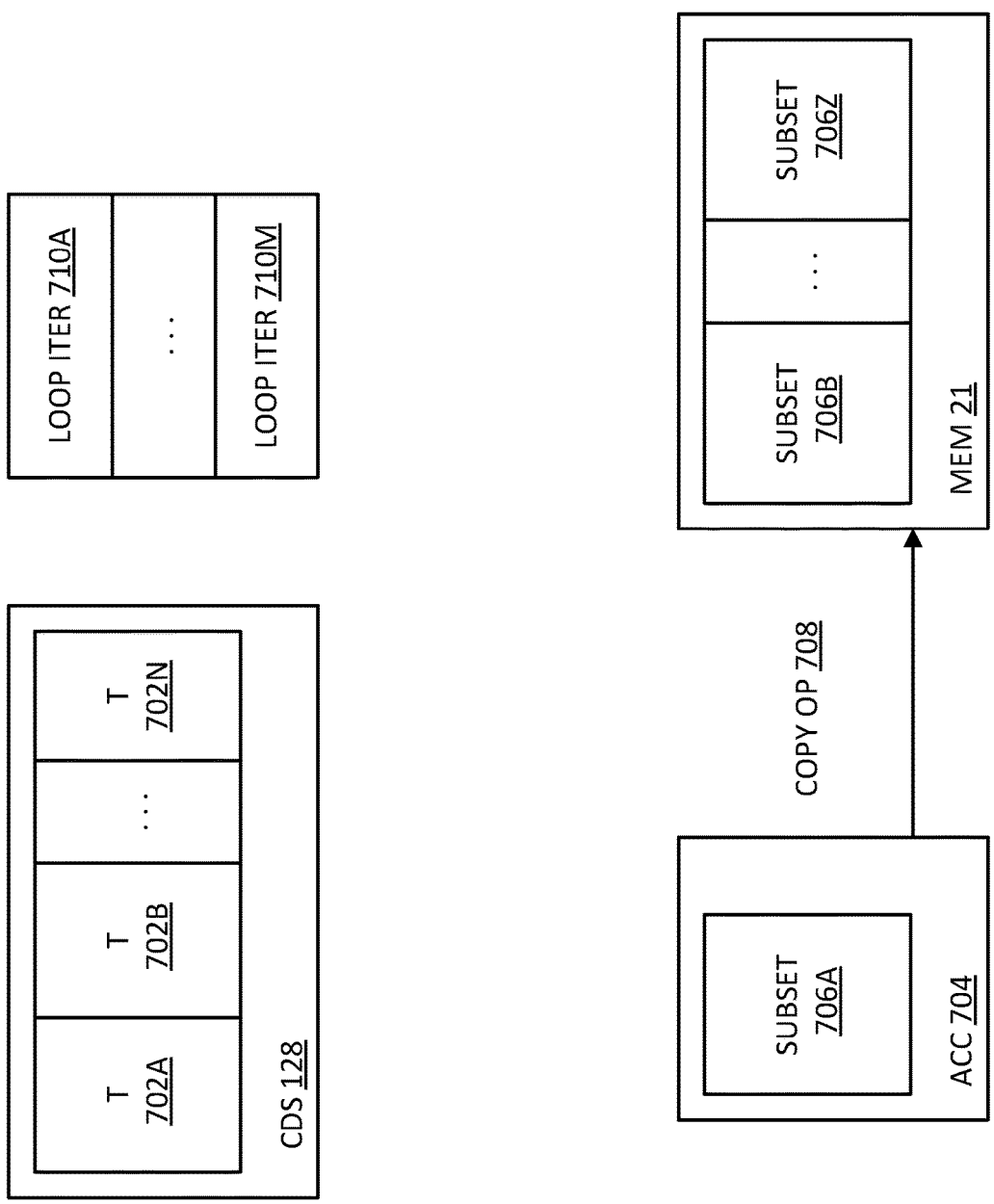

US 10,158,376 B2

TECHNIQUES TO ACCELERATE LOSSLESS COMPRESSION

CROSS-REFERENCE TO RELATED APPLICATIONS

This application is a divisional of, claims the benefit of and priority to previously filed U.S. patent application Ser. No. 13/538,826 filed Jun. 29, 2012, entitled "TECHNIQUES TO ACCELERATE LOSSLESS COMPRESSION", the subject matter of which is incorporated herein by reference in its entirety.

BACKGROUND

Conventional techniques exist to compress data. Examples of two lossless techniques that are disclosed in standards documents include: "DEFLATE Compressed Data Format Specification Version 1.3," Internet Engineering Task Force (IETF) Request for Comments (RFC) 1951, published May 1996 (hereinafter referred to as "Deflate" or the "Deflate technique"); and "GZIP File Format Specification Version 4.3," IETF RFC 1952, published May 1996 (hereinafter referred to as "Gzip" or the "Gzip technique"). The Deflate technique forms the basis for the Gzip technique.

The Deflate and Gzip techniques have gained relatively widespread use and acceptance. It would be desirable to increase the speed with which Deflate and/or Gzip-compatible compression-related operations may be carried out, without substantially deleteriously impacting the compression ratio of the resulting compressed data.

BRIEF DESCRIPTION OF THE DRAWINGS

FIG. 7 illustrates an embodiment of data blocks.

DETAILED DESCRIPTION

Figure 1:
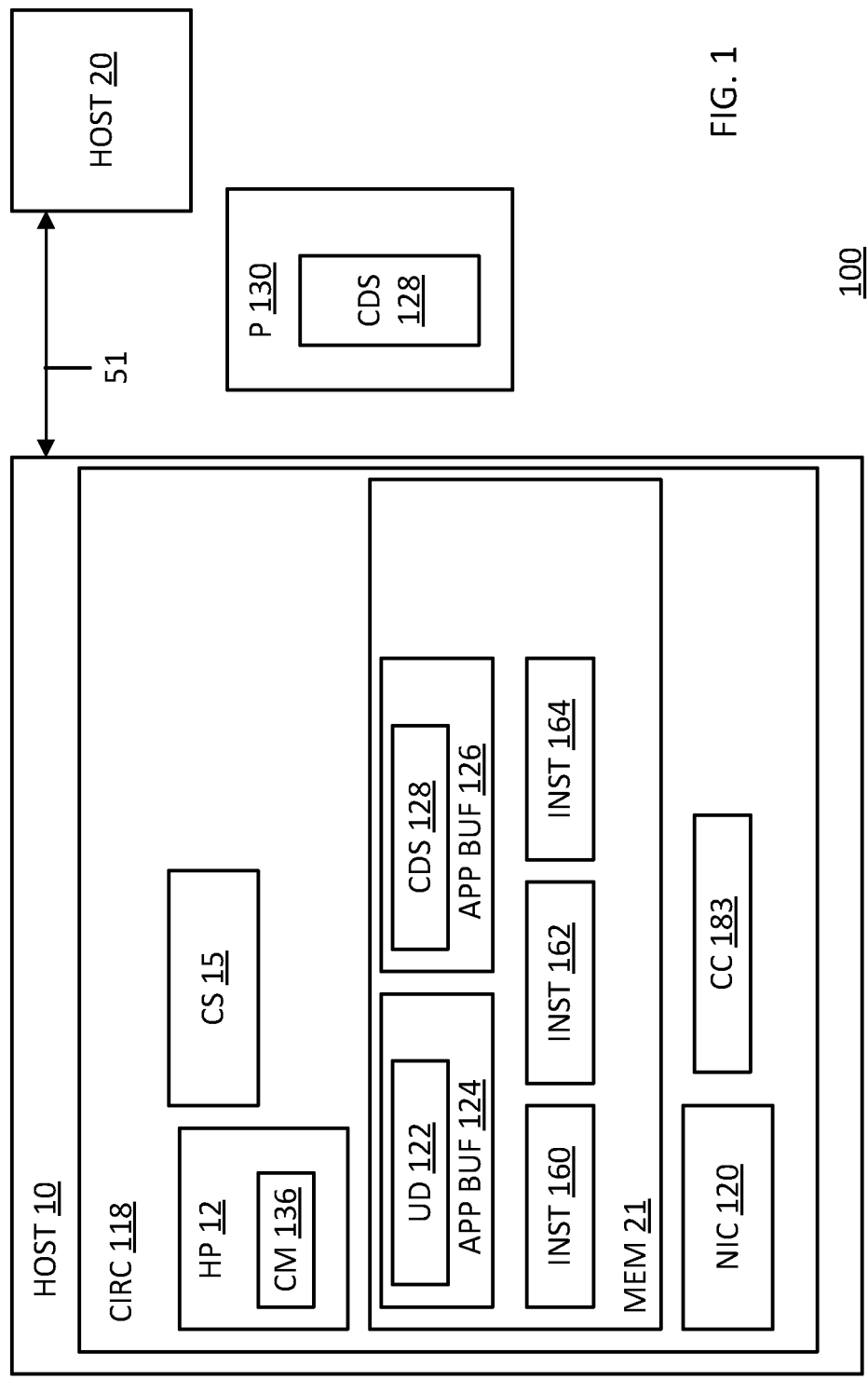
FIG. 1 illustrates an embodiment of system.

FIG. 1 illustrates a system embodiment 100. System 100 may be or comprise a network that may comprise, for example, one or more hosts 10 that may be communicatively coupled via one or more communication links 51 to one or more hosts 20.

The respective construction and/or operation of one or more hosts 10 may be the same, at least in part, to the respective construction and/or operation of one or more hosts 20. Alternatively, without departing from this embodiment, the respective constructions and/or operations of hosts 10 and 20 may differ from one another, at least in part.

In this embodiment, the terms "host computer," "host," "server," "client," "network node," and "node" may be used interchangeably, and may mean, for example, without limitation, one or more end stations, mobile internet devices, smart phones, media devices, input/output (I/O) devices, tablet computers, appliances, intermediate stations, network interfaces, clients, servers, and/or portions thereof. In this embodiment, a network may be or comprise any mechanism, instrumentality, modality, and/or portion thereof that permits, facilitates, and/or allows, at least in part, two or more entities to be communicatively coupled together. In this embodiment, a packet and/or frame may be or comprise one or more values. Also in this embodiment, a first entity may be "communicatively coupled" to a second entity if the first entity is capable of transmitting to and/or receiving from the second entity one or more commands and/or data. In this embodiment, data and information may be used interchangeably, and may be or comprise one or more commands (for example one or more program instructions), and/or one or more such commands may be or comprise data and/or information. Also in this embodiment, an instruction may include data and/or one or more commands. In this embodiment, a communication link may be or comprise any mechanism that is capable of and/or permits, at least in part, at least two entities to be or to become communicatively coupled.

In this embodiment, "circuitry" may comprise, for example, singly or in any combination, analog circuitry, digital circuitry, hardwired circuitry, programmable circuitry, co-processor circuitry, state machine circuitry, and/or memory that may comprise program instructions that may be executed by programmable circuitry. Also in this embodiment, a processor, host processor, central processing unit, processor core, core, and controller each may comprise respective circuitry capable of performing, at least in part, one or more arithmetic and/or logical operations, and/or of executing, at least in part, one or more instructions.

In this embodiment, memory may comprise one or more of the following types of memories: semiconductor firmware memory, programmable memory, non-volatile memory, read only memory, electrically programmable memory, random access memory, flash memory, magnetic disk memory, optical disk memory, and/or other or later-developed computer-readable and/or writable memory. In this embodiment, cache memory or cache may comprise memory that is comprised in a processor.

In this embodiment, a portion or subset of an entity may comprise all or less than all of the entity. In this embodiment, a set may comprise one or more elements. Also, in this embodiment, a process, thread, daemon, program, driver, operating system, application, kernel, and/or virtual machine monitor each may (1) comprise, at least in part, and/or (2) result, at least in part, in and/or from, execution of one or more operations and/or program instructions.

In this embodiment, hosts 10 and 20 may exchange data and/or commands in accordance with one or more communication protocols. For example, in this embodiment, these one or more protocols may be compatible with, at least in part, e.g., one or more Ethernet, Transmission Control Protocol/Internet Protocol (TCP/IP), and/or other protocols.

For example, one or more Ethernet protocols that may be utilized in system 100 may comply or be compatible with, at least in part, IEEE Std. 802.3-2008, Dec. 26, 2008; IEEE Std. 802.1Q-2005, May 19, 2006; IEEE Std. 802.11a-1999, Feb. 11, 1999; IEEE Std. 802.11b-1999, Feb. 11, 1999; IEEE 802.11g-2003, Oct. 20, 2003; and/or IEEE 802.11n-2009, Oct. 29, 2009. The TCP/IP protocol that may be utilized in system 100 may comply or be compatible with, at least in part, the protocols described in Internet Engineering Task Force (IETF) Request For Comments (RFC) 791 and 793, published September 1981. Many different, additional, and/or other protocols (including, for example, those stated above) may be used for such data and/or command exchange without departing from this embodiment (e.g., earlier and/or later-developed versions of the aforesaid, related, and/or other protocols).

As shown in FIG. 1, one or more hosts 10 may comprise circuitry 118. Circuitry 118 may comprise one or more host processors 12, one or more chipsets 15, memory 21, special purpose compression/decompression circuitry 183, and/or network interface controller (NIC) 120. One or more host processors 12 may be communicatively coupled via one or more chipsets 15 to memory 21, circuitry 183, and/or NIC 120.

In this embodiment, circuitry 118 and/or one or more components thereof (e.g., one or more processors 12, one or more chipsets 15, circuitry 183, and/or NIC 120) may be capable of performing, at least in part, one or more compression-related (and/or decompression-related) operations. In this embodiment, input and/or output may be or comprise data, such as, one or more files resident (at least temporarily) in memory 21. Also in this embodiment, compression and/or compressing may comprise one or more operations and/or algorithms comprised in, facilitating, and/or resulting in, at least in part, reduction in size of input data to produce output data, such as, for example, in a manner that may permit at least one portion of the input data to be recoverable based at least in part upon the output data. Also in this embodiment, decompression and/or decompressing may comprise one or more operations comprised in, facilitating, and/or resulting in, at least in part, recovery of at least one portion of such input data based at least in part upon such output data. In this embodiment, a data stream may include, but is not limited to, data that is input and/or output as one or more sequences and/or formats. Additionally or alternatively, a data stream may, at least in part, embody and/or permit parallel input and/or output of data.

Alternatively or additionally, without departing from this embodiment, special purpose circuitry 183 may be comprised, at least in part, in one or more host processors 12, one or more chipsets 15, and/or NIC 120. Further alternatively or additionally, circuitry 183 may be eliminated, at least in part, from circuitry 118, one or more host processors 12, one or more chipsets 15, and/or NIC 120, and/or the compression/decompression-related operations may be performed, in whole or in part, as a result of execution of one or more machine-executable program instructions by one or more processors 12, one or more chipsets 15, and/or NIC 120. Such instructions may be stored, at least in part, for example, in memory 21.

In this embodiment, these one or more compression-related operations may be executed to compress input data such as uncompressed data 122. Uncompressed data 122 may be stored in one or more application data buffers 124 in memory 21, and compressed to produce one or more output data such as compressed data streams 128. In this embodiment, an application data buffer 124 may comprise and/or store data associated with one or more applications. One or more compressed data streams 128 may be stored in one or more application data buffers 126. Additionally or alternatively, one or more compressed data streams 128 may be communicated utilizing one or more packets 130.

One or more compressed data streams 128 may be compressed utilizing Deflate and/or Gzip techniques. Accordingly, the one or more compression-related operations that may be carried out by circuitry 118 may result in one or more compressed data streams 128 complying and/or being compatible with, at least in part, Deflate and/or Gzip. Analogously, the one or more decompression-related operations that may be carried out by circuitry 118 may be carried out in a manner that may comply and/or be compatible with, at least in part, Deflate and/or Gzip. Of course, without departing from this embodiment, one or more compressed data streams 128 and/or one or more decompression-related operations that may be performed by circuitry 118 may not comply and/or be compatible with, at least in part, Deflate and/or Gzip.

Figure 2:
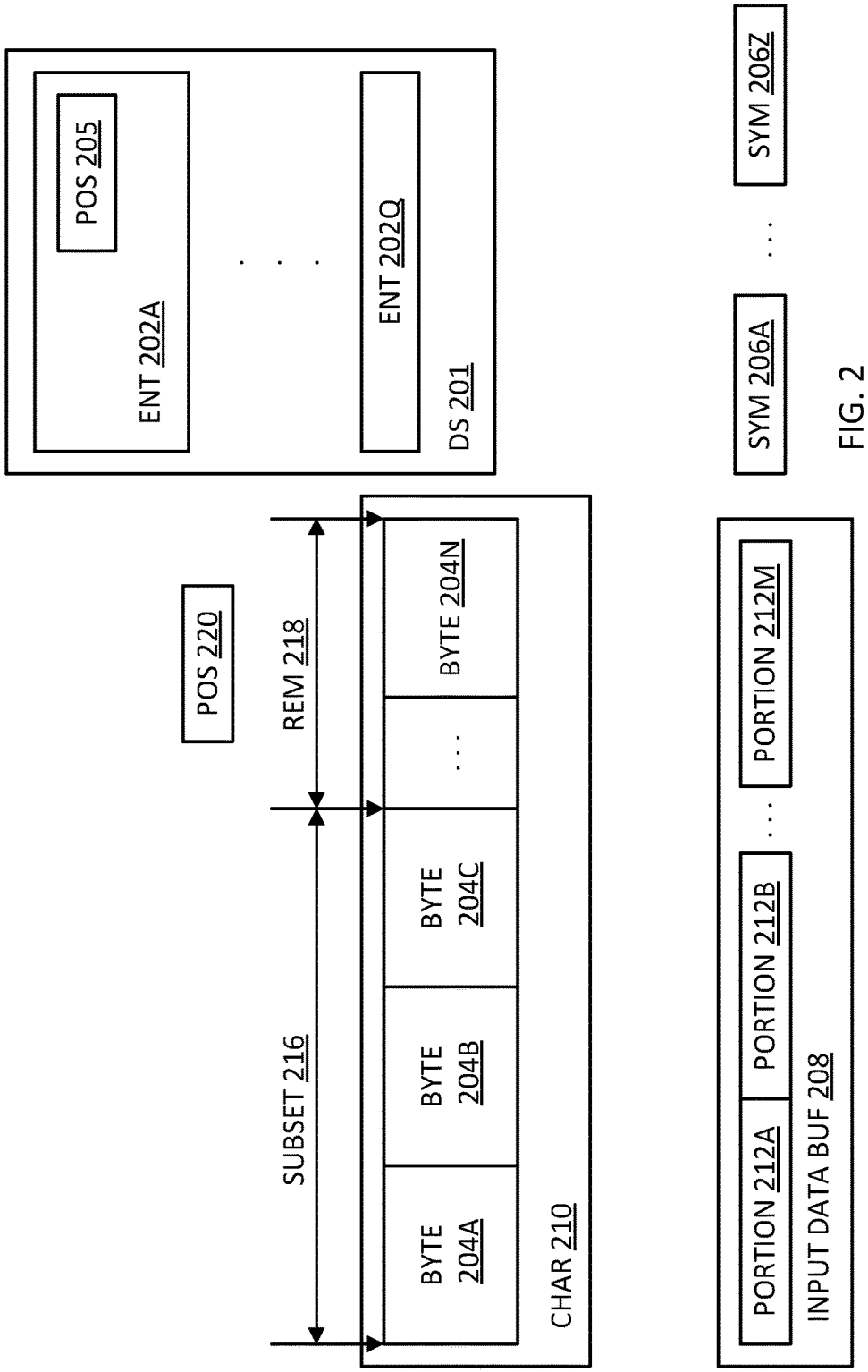
FIG. 2 illustrates an embodiment of a data structure.

FIG. 2 illustrates one embodiment of a data structure. As shown in FIG. 2, circuitry 118 may be arranged to perform one or more compression-related operations, such as indicating in a data structure 201 one or more positions 205 of one or more subsets 216 of characters 210 that are to be encoded as a symbol 206A as a result of compression encoding. Circuitry 118 may produce, for example, a plurality of symbols 206A . . . 206Z to be used to generate compressed data stream 128. The one or more positions 205 may be within and/or with reference to one or more portions 212A . . . 212M of an input data buffer 208. The input data buffer 208 may correspond to, for example, application buffer 124 and/or uncompressed data 122. The one or more subsets 216 may comprise less than the entirety of the characters 210. A position 220 of one or more remaining portions 218 of characters 210 may not be indicated in the data structure 201. The remaining portion 218 may be distinct from, other than, and/or follow the one or more subsets 216 in the characters 210. As shown in FIG. 2, by way of example, a subset 216 may comprise at most three respective bytes 204A, 204B, 204C at a beginning portion of the characters 210. The remaining portion 218 of the characters 210 may comprise one or more respective bytes 204N that may follow these three or fewer bytes 204A, 204B, 204C in the beginning portion of the characters 210.

Circuitry 118 may generate and/or maintain data structure 201. Data structure 201 may comprise one or more entries 202A . . . 202Q. Each of these entries 202A . . . 202Q may indicate at least one position of these one or more subsets 216 in portions 212A . . . 212M and/or input data buffer 208. For example, one or more positions 205 may be specified and/or indicated, at least in part, in terms of one or more distances that one or more subsets 216 may be from one or more reference points (not shown) in portions 212A . . . 212M and/or input data buffer 208.

In various embodiments, the data structure 201 may be implemented as one or more linked lists, tables, and/or other data structures that may be indexed and/or accessible by one or more look-up operations involving one or more hash values. These one or more hash values may be generated based upon the subsets 216 of portions 212A . . . 212M and/or input data buffer 208. Of course, many variations, modifications, and alternatives are possible in this regard without departing from this embodiment.

In one compression technique, every byte in every character sequence in the input data buffer is indicated in a table (or other data structure). For example, if a particular sequence that is seven bytes in length is to be encoded as a symbol, then each of the seven (overlapping) 3 byte sequences that start at each respective byte of the seven byte sequence is added in the table. The resulting table is used to generate a list of previously-occurring/encountered sequences in the input data buffer 208 that may match a currently examined sequence in the input data buffer 208. However, indicating every byte in every character sequence of the input data buffer in a table is an inefficient use of memory and computational resources, particularly since the list of previous sequences are merely potential matches.

In contrast to this compression technique, certain embodiments only add positions associated with the first few bytes (e.g., 1-3 bytes) of a respective character sequence that is to be encoded as a symbol or length/distance pair into the data structure 201. The positions may be represented using any technique, such as pointers, offsets, indicators, addresses, and so forth. Positions for any other bytes in that respective character sequence are not added to data structure 201. For example, subset 216 of character 210 may comprise three respective bytes 204A, 204B, 204C, and remaining portion 218 of character 210 may comprise byte 204N. However, none of the respective positions of any of the bytes that may be comprised in remaining portion 218 are indicated in data structure 201. Accordingly, in this example, the one or more positions 220 of one or more bytes 204N are not indicated in any of the entries 202A . . . 202Q in data structure 201. Advantageously, these features in this embodiment may improve processing speed without necessarily or significantly decreasing compression ratios.

Such hashing may comprise, for example, one or more computational and/or logical operations involving one or more operands that may produce one or more hash values that may be meaningfully indicative and/or characteristic of the one or more operands and/or one or more properties/characteristics of the one or more operands. For example, such hashing may facilitate faster search and/or comparison operations, such as, for the purpose of locating respectively possibly corresponding and/or matching symbols. Also in this embodiment, a symbol may indicate, encode, be, or comprise a length of a subset of data and a position of that subset within the data. For example, in this embodiment, a symbol 206A . . . 206Z may encode one or more characters 210, for example, without literally and/or explicitly reciting the one or more characters 210. In this embodiment, a character 210 may be or comprise one or more bytes. In one embodiment, such symbols 206A . . . 206Z may be generated, at least in part, in accordance with techniques disclosed in and/or compatible with Gzip and/or Deflate.

Figure 3:
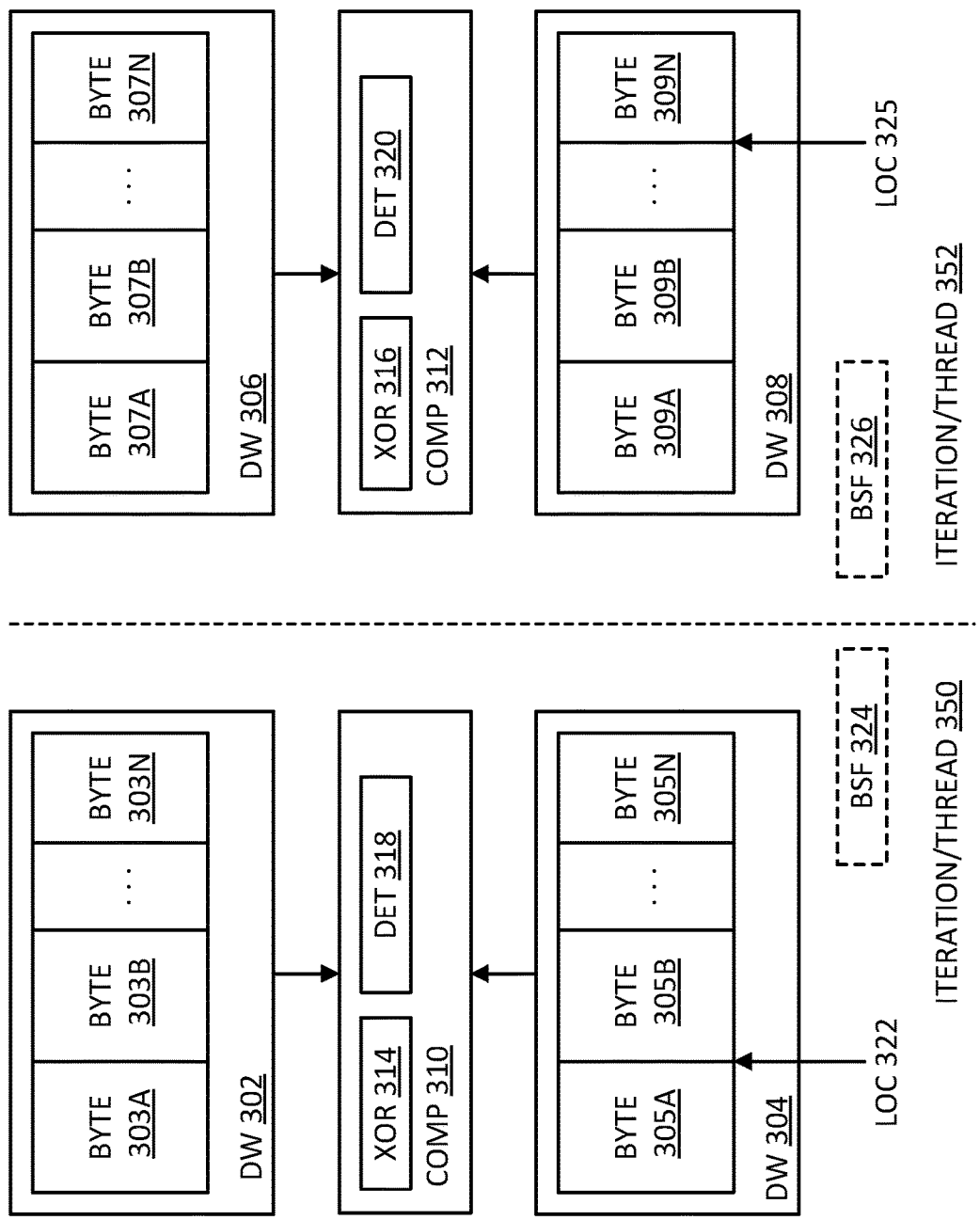
FIG. 3 illustrates an embodiment of a first logic diagram.

FIG. 3 illustrates some additional operations performed by circuitry 118. For instance, circuitry 118 may be capable of performing compression-related operations such as comparing 310 one or more pairs of multi-byte data words 302, 304. In one embodiment, each of these data words 302, 304 may be of identical predetermined fixed size. The comparing 310 may be based upon one or more exclusive-or (XOR) operations 314 involving the one or more pairs of data words 302, 304. If one or more mis-compares occur as a result of the one or more XOR operations 314, then the comparing 310 may comprise the determining 318 of a first location 322 in one data word 304 of the two data words 302, 304 at which the one or more mis-compares may occur. The comparing 310 may result from execution of a single instruction 160 by processor 12. Also, the determining 318 of the first location 322 may comprise and/or result from execution of one or more bit search forward (BSF) instructions 324, as performed by host processor 12 or other suitable processor.

As shown in FIG. 3, multiple respective pairs of multi-byte data words may be compared. For example, circuitry 118 may compare two or more pairs of data words in parallel, such as data words 302, 304 and data words 306, 308.

In one compression technique, only one or two data word bytes are able to be compared at a time for the purpose of determining whether strings in the input data buffer 208 match reference strings. In contrast to this compression technique, embodiments may utilize the host processor 12 to compare multiple pairs of multi-byte data words in parallel. In one embodiment, for example, the host processor 12 may be implemented as one or more Intel® microprocessors of the Intel® Core™ Processor Family, made by Intel Corporation, Santa Clara, Calif. Alternatively or additionally, the instruction set that may be executed by host processor 12 may be compatible, at least in part, with the instruction set of the Intel® Core™ Processor Family. Of course, other and/or later-developed processors and/or instruction sets may alternatively or additionally be implemented as host processor 12 without departing from this embodiment.

Advantageously, by comprising one or more such microprocessors in host processor 12, host processor 12 may be capable of contemporaneously comparing, in parallel, all of the bytes in pairs of 8-byte data words using one or more XOR operations. Further, if one or more mis-compares result, the host processor 12 may execute one or more BSF instructions 324 that may result in host processor 12 determining one or more locations (e.g., a first location) in one or more these data words at which the one or more mis-compares occur. Advantageously, this may permit such comparison and/or location determining operations to be carried out more efficiently and faster in this embodiment.

For example, host processor 12 may execute in parallel and/or concurrently respective threads 350, 352 and/or iterations of a program loop. In thread 350 the host processor 12 may compare, via one or more XOR operations 314, bytes 303A . . . 303N of data word 302 with corresponding bytes 305A . . . 305N of data word 304. The comparison 310 and/or XOR 314 operations may result from execution by host processor 12 of a single respective instance 160 of an instruction. That is, all or at least a substantial subset of the operations involved in comparison operation 310 and/or one or more XOR operations 314 may result from execution by host processor 12 of a single respective instruction instance 160 that may be comprised in the instruction set that host processor 12 may be capable of executing. Of course, without departing from this embodiment, such comparison and/or XOR operations may result from execution of multiple instructions. In the event that one or more mis-compares result from these one or more XOR operations 314, host processor 12 may execute one or more instances of BSF instruction 324 to locate one or more byte locations 322 (e.g., the first such byte location) at which these one or more mis-compares are present in data word 304 (e.g., at the start of byte 305B).

Concurrently, in thread 352, host processor 12 may compare, via one or more XOR operations 316, bytes 307A . . . 307N of data word 306 with corresponding bytes 309A . . . 309N of data word 308. The comparison 312 and/or XOR 316 operations may result from execution by host processor 12 of a single respective instance 160 of an instruction. That is, all or at least a substantial subset of the operations involved in comparison operation 312 and/or one or more XOR operations 316 may result from execution by host processor 12 of a single respective instruction instance 160 that may be comprised in the instruction set that host processor 12 may be capable of executing. Of course, without departing from this embodiment, such comparison and/or XOR operations may result from execution of multiple instructions. In the event that one or more mis-compares result from these one or more XOR operations 316, host processor 12 may execute one or more instances of BSF instruction 326 to locate one or more byte locations 325 (e.g., the first such byte location) at which these one or more mis-compares are present in data word 308 (e.g., at the start of byte 309N).

Although not shown in FIG. 3, threads 350, 352 (or loop iterations) may comprise more than two such threads. Also, the code comprising such loop iterations may be unrolled to speed execution (e.g., by a factor of 2) of the resulting code, and to permit at least two 8-byte compares to be performed per iteration. Without departing from this embodiment, in order to reduce the latency that might otherwise result from execution of two conditional branches, two such compares may be executed in parallel, and a conditional move (CMOV) instruction may be executed that may combine the comparison results to permit a single conditional branch to be exited prior to exiting the loop.

In various implementations, the respective numbers and/or sizes of the data words and/or the portions of the respective pairs of data words that may be compared in the above manner may vary. Additionally, the number of threads and/or iterations executed in parallel and/or contemporaneously by host processor 12 may vary without departing from this embodiment.

Figure 4:
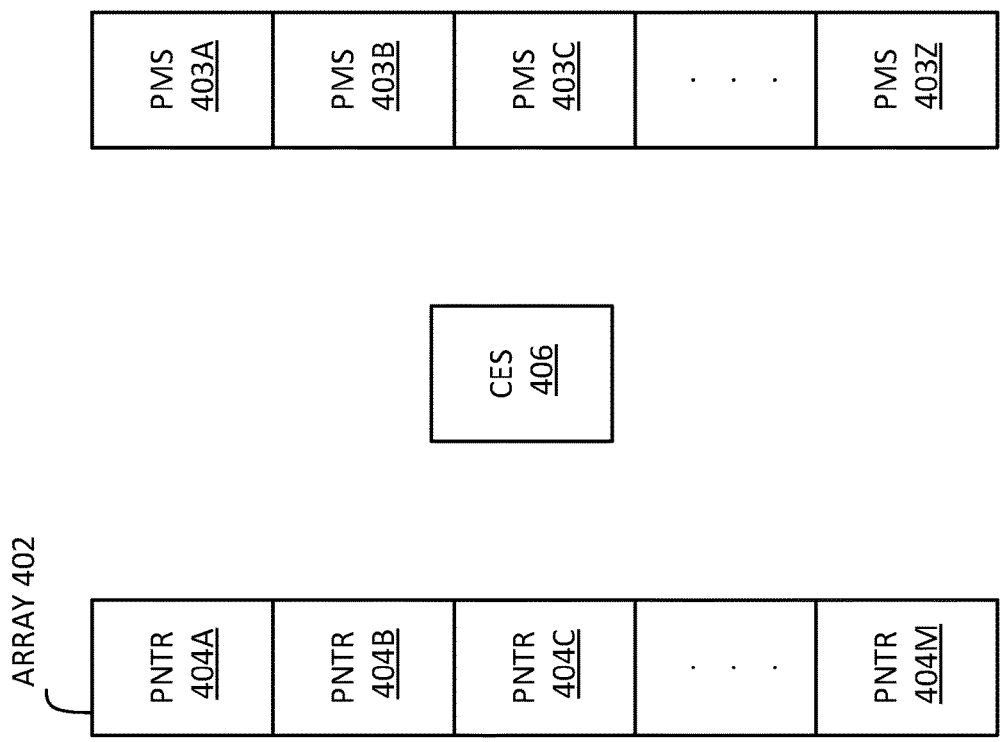
FIG. 4 illustrates an embodiment of an array.

FIG. 4 illustrates an embodiment of an array suitable for use by the circuitry 118. To perform compression-related operations, circuitry 118 may be capable of maintaining an array 402 of pointers 404A . . . 404M to potentially matching strings (PMS) 403A . . . 403Z. The circuitry 118 may use the pointers 404A . . . 404M of the array 402 to compare some or all of the PMS 403A . . . 403Z with one or more currently examined strings (CES) 406. Once comparison operations are performed on some or all of the PMS 403A . . . 403Z, the circuitry 118 attempts to determine which of the PM 403A . . . 403Z provides a longest match in terms of bytes with the CES 406. For instance, the circuitry 118 may maintain a counter of how many matching bytes are at a given position in the array 402, where the counter could be 0 or greater. The circuitry 118 then selects a PMS 403A . . . 403Z with the longest match based on the counter. The circuitry 118 may then take a branch in program code depending on whether a longest match is less than a defined threshold, such as 3 bytes, for example. In the event of a tie, where there are two or more PMS 403A . . . 403Z with a same longest match, then the circuitry 118 selects the closer (e.g., most recent) match.

The list of PMS 403A . . . 403Z may be of any arbitrary length of the most recent previous strings, such as a predetermined number (e.g., 1, 2, 4, 8, etc.), less than a predetermined number (e.g., less than 9), and so forth. The list of pointers may be or comprise an array 402 of only a relatively small number of respective pointers 404A, 404B, 404C, . . . 404M to the most recent previous strings, such as those that have been encountered in and/or as a result of the one or more compression-related operations 403A, 403B, 403C, . . . 403Z.

In one compression technique, a relatively large linked-list of pointers is maintained. The list of pointers are to all of the reference and/or previously encountered strings that might potentially match an input buffer string that is currently being examined, and each of these potentially matching reference strings is examined in turn. This is expensive and inefficient. By way of contrast, embodiments may utilize an array 402 comprising only the predetermined number of pointers. The predetermined number may be empirically determined or otherwise selected in such a way as to balance trade-offs in terms of code performance and/or speed and resultant compression ratio of the compressed data streams 128. For example, array 402 may comprise only the predetermined number of pointers 404A, 404B, 404C, . . . 404M. These pointers 404A, 404B, 404C, . . . 404M may respectively be to the corresponding number of mostly previously encountered strings 403A, 403B, 403C, . . . 403Z. These may be strings most recently encountered in and/or as a result of processing by the circuitry 118 of uncompressed data 122 to order to produce an output compressed data stream 128. The sequence order of the pointers 404A, 404B, 404C, . . . 404M in the array 402 may correspond to the relative order in which the strings 403A, 403B, 403C, . . . 403Z were encountered, with the pointer 404A pointing to the last such string encountered. For example, assume the predetermined number is set equal to four, after a new (e.g., previously unencountered) respective string in uncompressed data 122 is encountered in and/or as a result of such processing, circuitry 118 may: (1) shift treatment of the current respective strings 403A, 403B, and 403C so that they are treated as strings 403B, 403C, and 403Z, respectively; (2) treat the new respective string as the new most recently encountered string 403A; (3) shift the current respective pointers 404A, 404B, and 404C so that they are stored as pointers 404B, 404C, and 404M, respectively, and/or (4) store, as pointer 404A, a new respective pointer to the new most recently encountered string 403A. In this case, the string 406 in uncompressed data 122 that is currently under examination to determine whether it matches any of the most recently encountered strings 403A . . . 403Z is compared in turn to each of the strings 403A . . . 403Z pointed to by the pointers 404A . . . 404M in the array 402 to determine whether a match may be found. Such examination, in turn, of strings 403A . . . 403Z may continue until one or more matches with string 406 are found. Additionally or alternatively, in this embodiment, such examination, in turn, of strings 403A . . . 403Z may continue only until a first match with one of the strings 403A . . . 403Z is found. In either case, the one or more such matching strings thus found may be utilized to produce one or more references for use in compressing uncompressed data 122 to produce compressed data stream 128.

The above operations involved and/or associated with comparing string 406 with strings 403A . . . 403Z to determine whether one or more of the strings 403A . . . 403Z may match string 406, may be performed as result of execution by host processor 12 of a single respective instance of a single instruction 162. Of course, without departing from this embodiment, these above operations may be performed as a result of execution by host processor 12 of multiple instructions. Advantageously, these above operations in this embodiment may be carried out more efficiently and faster, and may use less memory and/or fewer memory operations, than may be possible in a conventional technique. Further advantageously, in this embodiment, the pointers 404A . . . 404M may be respective 16-bit pointers that may be stored together in a single respective 64-bit register. Advantageously, this may further enhance the efficiency and speed of operation of this embodiment, while reducing memory and memory operation usage.

Figure 5:
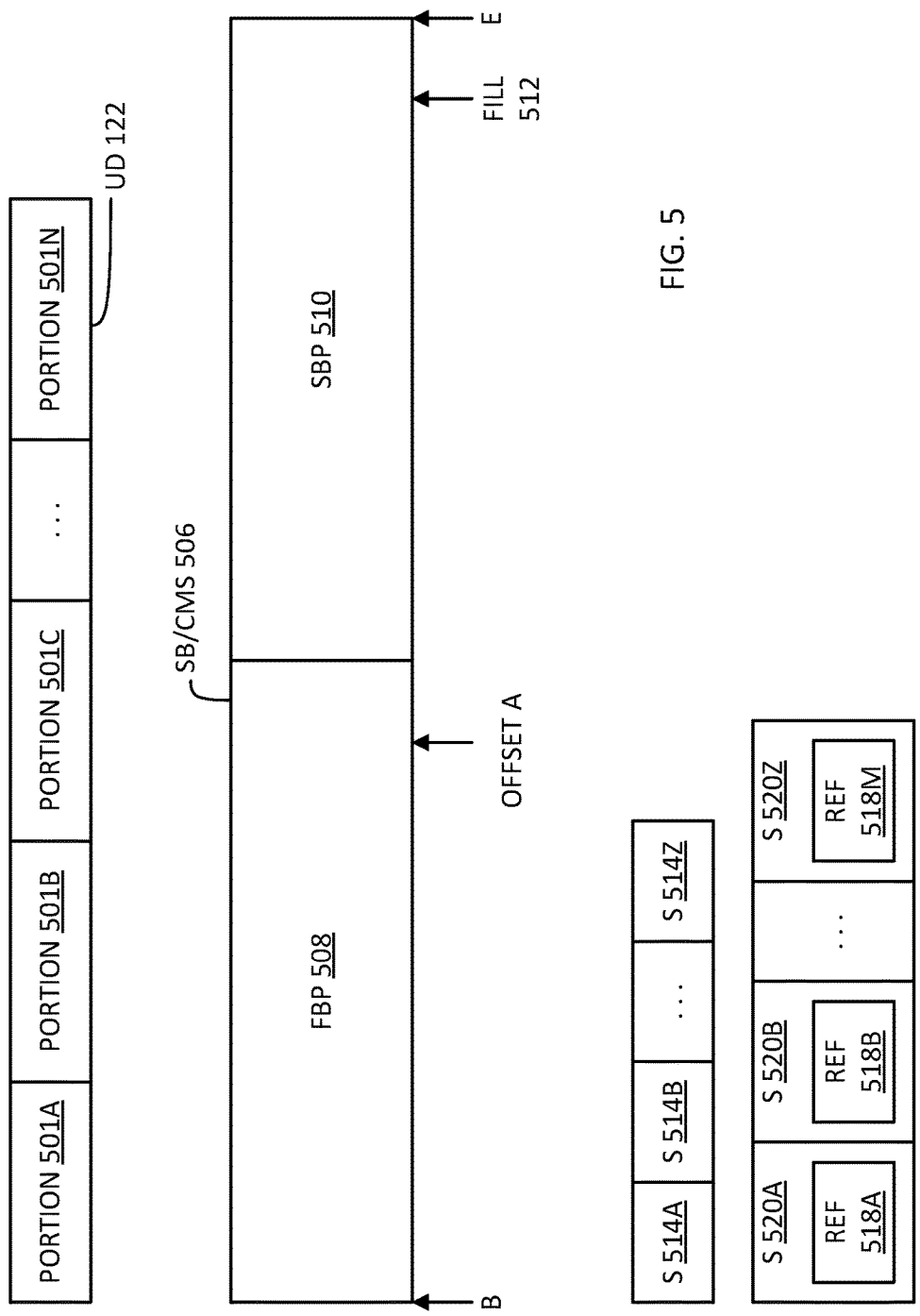
FIG. 5 illustrates an embodiment of a buffer.

FIG. 5 illustrates an embodiment of a buffer suitable for use by circuitry 118. When performing compression-related operations, circuitry 118 may be capable of allocating a first buffer portion (FBP) 508 to store one or more portions 501A of uncompressed data 122 that is to be input for compression to produce a compressed data stream 128. The first buffer portion 508 may store one or more portions 501A of the uncompressed data 122 that have been most recently processed by circuitry 118 to produce one or more portions of the compressed data stream 128. The one or more portions 501A may have been most recently previously input for this compression, although many alternatives and/or modifications are possible without departing from this embodiment. The circuitry 118 may also allocate, as part of one or more compression-related operations, a second buffer portion (SBP) 510 to store one or more other portions 501B of uncompressed data 122. The portions 501B may comprise current input for compression operations. Circuitry 118 may compare corresponding strings 520A . . . 520Z and 514A . . . 514Z in the first buffer portion 508 and the second buffer portion 510, respectively, to determine presence of one or more references 518A . . . 518M to be used in generating the compressed data stream 128.

In one embodiment, the first buffer portion 508 and the second buffer portion 510 may be stored in a single buffer (SB) and/or contiguous memory space (CMS) 506 (referred to hereinafter as "single buffer 506"). The single buffer 506 may have a size chosen to permit the single buffer 506 (and associated data) to be stored in a contiguous memory space, such as a cache memory 136 of the host processor 12. The cache memory 136 may comprise, for example, a level 1 processor cache for the host processor 12. However, in some cases, a size of single buffer 506 may be larger than the cache memory 136.

In basic operation, when more uncompressed data 122 is to be added to the single buffer 506, and the single buffer 506 is not full, then as much data is copied into the end of the single buffer 506 until either: (1) the single buffer 506 becomes full; or (2) all of the presently available input data is copied. When the single buffer 506 is full, then D bytes is copied from the end of the single buffer 506 to the beginning of the single buffer 506, after which the single buffer 506 is no longer empty and copying of input data into the single buffer 506 may continue. The variable D may represent a maximum history buffer size.

In one compression technique, a local buffer corresponds only to a portion of the single buffer 506 (e.g., the first D bytes). In general, this represents the last D bytes from the previous user input buffers. The user's buffer is analogous to the second buffer portion 510. At the end of the user's buffer, assuming the user's buffer was at least D bytes in size, the most recent D bytes are copied to the local buffer.

By way of contrast, various embodiments may allocate the first buffer portion 508 together with the single buffer 506 in the cache memory 136. This allows for a resolution of references/positions into a single buffer 506. In this manner, the program code does not need to check multiple buffers to resolve a reference.

The single buffer 506 may have a size that may be selected to permit the single buffer 506 to be used in a manner that may be considered analogous to an internal processor cache memory buffer for purposes of the one or more compression-related operations that may be carried out by circuitry 118. In one embodiment, for example, the single buffer 506 may have a size that may be equal to twice D (e.g., 2*D) bytes, where D represents a maximum history buffer size, plus any relatively small additional space allocated for any other data (e.g., additional and/or related data) to be included in the single buffer 506. For purposes of clarity, however, such additional space is not shown in FIG. 5. Rather, FIG. 5 illustrates the single buffer 506 as including only buffer portions 508, 510. As a result, certain memory operations described herein with reference to FIG. 5 may be modified in actual implementation to take this additional space into account.

Returning to the previous discussion, the size of single buffer 506 may be approximately equal to twice D bytes. In one embodiment, D bytes may be equal to 8 kilobytes, and therefore, twice D bytes may be equal to 16 kilobytes. For the aforesaid type of microprocessor, and depending upon the particular implementation of this embodiment, a memory space of approximately 16 kilobytes may be sufficiently small to permit all (or substantially all) of it to be stored as a single memory space (e.g., single buffer 506) in the level 1 cache of such microprocessor, and therefore, also of host processor 12. In this embodiment, a level 1 processor cache may comprise or be implemented as: (1) integrated in the same integrated circuit chip (not shown) as the processor itself; (2) the first level of the processor's cache memory to be checked by the processor for data requested and/or referred to by one or more of the processor's instructions; and/or (3) the cache level and/or memory that may exhibit the least access latency for the processor. Of course, other cache levels and cache memory types may be employed for a given implementation. The embodiments are not limited in this context.

As shown in FIG. 5, the single buffer 506 may begin at beginning B and end at end E. In operation, circuitry 118 may sequentially store as appropriate portions 501A, 501B, 501C of uncompressed data 122 in the first and second buffer portions 508, 510, and processed to produce the compressed data stream 128. As a result, the respective sizes of first and second buffer portions 508, 510 in buffer 506 may change. During these operations, circuitry 118 may determine whether sufficient space remains in the single buffer 506 to permit additional data to be copied into the single buffer 506 from uncompressed data 122 without overwriting data that is already stored in the single buffer 506. If sufficient space does remain in single buffer 506 to permit such copying, such additional data is copied to the second buffer portion 510.

Conversely, during such operations, if insufficient space remains in the single buffer 506 for such copying, then an internal copy operation of data that is currently stored in the single buffer 506 is performed. By way of example, if the amount of valid data presently stored in the single buffer 506 fills the single buffer 506 to the level indicated by fill line 512, then circuitry 118 may select D bytes (or alternatively, different predetermined size) of data that may be presently stored between an offset A and the fill line 512 in buffer 506, and may copy the selected D bytes of data into the first buffer portion 508, thereby overwriting the data currently in first buffer portion 508 with such selected and copied data, starting at the beginning B of buffer 506. Offset A may be selected by circuitry 118 so as to permit the amount of selected data to be equal to D bytes. As will be appreciated, depending upon the particular implementation, since this copy operation may involve a data block of fixed size, it may be carried out in a maximally efficient manner. In this embodiment, the source of the copy operation may be unaligned, but the destination may be aligned, and ordinary memory semantics may be employed so that cache memory 136 may be accessed.

After the D bytes of selected data have been copied into first buffer portion 508, additional uncompressed data 122 is copied into the single buffer 506, starting at the end of the selected data that was previously copied into first buffer portion 508. Processing by circuitry 118 may then continue, in the above manner, until completion of the generation of compressed data stream 128.

Depending upon the particular implementation, a load involved with the copying of the additional data may employ, for example, non-temporal or streaming memory type MOVNTDQA operation to avoid cache thrash. To align this operation, 31 or fewer bytes may be copied using, for example, MOVDQU (unaligned load). For greater efficiency, the copy may be rounded up to an integral number (after alignment) of DQ words (e.g., 16-byte/128-bit). Because the source of the loads may be aligned, this rounding may not cause the load operation to extend between the source buffer into a bad (e.g., invalid) memory page. In order to compensate for issues that could otherwise result from unaligned writing, single buffer 506 may be allocated at least 2D+16 bytes (e.g., 16 kilobytes plus 16 bytes). This may permit the amount of valid data written into the single buffer 506 to be less than 2D bytes.

Advantageously, by placing both the first buffer portion 508 and the second buffer portion 510 into a single buffer 506 in the memory cache 136, the resulting program code may be simplified as so as to avoid issues that might otherwise arise from unpredictable branches and/or straddling of the data of the buffer portions 508, 510 across multiple disjoint and/or non-contiguous memory spaces and/or buffers. Further advantageously, the buffer portions 508, 510 and/or the single buffer 506 may be sized so as to fit (or substantially fit) into level 1 processor cache such as cache memory 136, and/or the copying data into the buffer portions 508, 510 may place such data directly into the cache memory 136. Advantageously, this may reduce and/or prevent processor stalling in connection with reference comparison and/or processing operations that might otherwise result from waiting for the filling of the processor's cache, and otherwise improve the speed and/or efficiency of processing in this embodiment. Further advantageously, in the case in which the single buffer 506 is larger than the cache memory 136, loading into the single buffer 506 of the application/user data that is currently being operated upon in this embodiment may improve the speed and/or efficiency of processing in this embodiment.

Referring again to FIG. 5, circuitry 118 may perform other compression-related operations as well such as performing a plurality of fixed-length comparisons involving most of the uncompressed data 122. These fixed-length comparisons may involve all of respective portions 501A . . . 501C, and some or all of final portion 501N, of uncompressed data 122. Some or all of final portion 501N may be compared in a final variable-length comparison.

In one compression technique, in order to avoid performing reference comparison operations on data falling outside an end of the uncompressed data buffer, multiple variable-length comparison operations may be employed, such as multiple comparison operations involving respective variable length portions of the uncompressed data. Accordingly, particular length values are calculated and provided to the comparison function/subroutine at runtime. Variable-length comparison operations may be a relatively slow and computationally expensive compared to, for example, fixed-length comparisons.

To solve this problem, some embodiments attempt to utilize fixed-length comparison operations for a majority of uncompressed data 122, and variable-length comparison operations for the remainder of uncompressed data 122. This may be accomplished, for example, by utilizing a predetermined guard size for the single buffer 506 to ensure the fixed-length comparison operations never run out of fixed-length data from a stream of uncompressed data 122.

In one embodiment, circuitry 118 may be arranged to process most of the portions 501A . . . 501N of the uncompressed data 122 using fixed-length comparison operations. The portions 501A . . . 501N may comprise any fixed-size or variable-size as desired for a given implementation. The portions 510A . . . 501N may comprise any arbitrary size as long as the selected size does not extend to within a predetermined guard size of an end for a stream (or block) of uncompressed data.

A predetermined guard size ensures that the fixed-length comparison operations can be performed on uncompressed data 122 in the single buffer 506 without running out of data. The predetermined guard size should be equal to, or greater than, a size used by a fixed-length comparison operation. For instance, if a fixed-length comparison operation is set to a fixed-length 258-byte compare, then a predetermined guard size may be set to 258 bytes (or greater). In one embodiment, for example, a predetermined guard size may be equal to a maximum size permitted by Deflate and/or Gzip, which is 258 bytes, among other sizes. A predetermined guard size may be hard coded prior to runtime. Advantageously, this may allow safe use of fixed-length comparison operations (e.g., 258 bytes) to improve the efficiency and speed of such comparison (and/or other) operations in this embodiment.

For example, if the uncompressed data 122 is viewed as an input data stream, then arbitrary size blocks 501A . . . 501N of the stream may be processed using fixed-length comparison operations until such time as only a predetermined guard size of bytes of uncompressed data 122 is left for processing in the single buffer 506. If the predetermined guard size is set to 258 bytes, then circuitry 118 performs fixed-length comparison operations on uncompressed data 122 (e.g., portions 501A . . . 501C) until 258 bytes of final portion 501N remains to be processed. When it is apparent that no uncompressed data 122 in addition to the last 258 bytes remain to be processed, then the last remaining 258 bytes may be processed using variable length comparison processing techniques.

Various buffer management techniques may be utilized to ensure that a predetermined guard size of uncompressed data 122 is not processed until all other uncompressed data 122 has already been processed. For example, assume a user provides a series of four D byte blocks, where D is equal to 8K. Circuitry 118 would process approximately 7934 bytes of the first buffer (e.g., 8K−258). At this point, D bytes are in the single buffer 506. When circuitry 118 receives the next D bytes from the user, these are copied to end of the single buffer 506. Then circuitry 118 processes the 8K bytes starting at position=8K-258 going up to position=16K-258. When the user gives circuitry 118 the third 8K buffer, circuitry 118 copies 8K+256 bytes to the start of the single buffer 506. At this point, the single buffer 506 contains 8K of previous-processed data and 258 bytes of future-processed data. The new D bytes are copied after this. It is worthy to note that in this example an actual size for the single buffer 506 is 2D+258 rather than 2D. So after this copy, circuitry 118 has D bytes of old data and D+258 bytes of new data. Circuitry 118 processes D (8 k) bytes of data, ending 258 bytes from the end. The 4th D bytes of data are processed in a similar manner. At this point circuitry 118 has processed all but the last 258 bytes of data in approximately 8K chunks. Now rather than giving circuitry 118 more data, the user indicates that there is no more data. Circuitry 118 can then process the last 258 bytes of data using a variable-length compare function. Embodiments are not limited to this particular technique.

Figure 6:
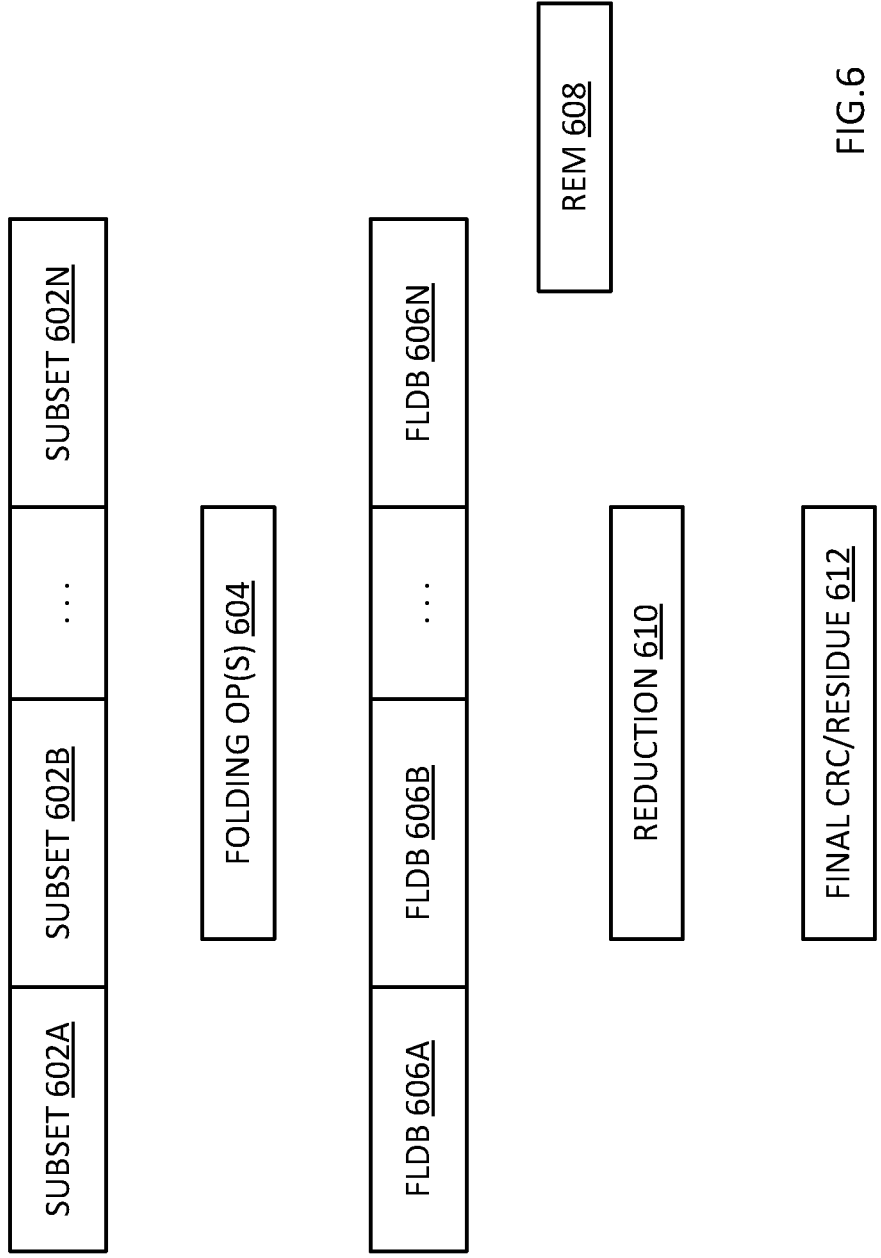
FIG. 6 illustrates an embodiment of a second logic diagram.

FIG. 6 illustrates calculating a final cyclic redundancy check (CRC) value for uncompressed data 122. The circuitry 118 may be arranged to generate a CRC value for uncompressed data 122 in a more efficient manner relative to conventional techniques.

In one compression technique, table look-ups are used to process any given number of bytes of input at a time. Results are then combined into a reduced number of bytes of CRC state information, which in turn are further reduced into a final CRC value. For instance, assume four bytes of input data in four different tables (e.g., one byte per table) are processed in parallel. The four byte results are then merged and used to calculate a CRC value. This process of reducing and calculating a CRC for every block of input data can be computationally expensive.

Embodiments attempt solve these and other problems by performing folding operations on subsets of input data, and doing a single reduction after folding operations are completed. As shown in FIG. 6, circuitry 118 may perform one or more folding operations 604 that may involve one or more subsets 602A . . . 602N of the uncompressed data 122. The folding operations 604 may produce one or more fixed-length data blocks (FLDB) 606A . . . 606N. In one embodiment, for example, the folding operations 604 may generate a FLDB 606A from a subset 602A. Once FLDB 606A is generated, the folding operations 604 may generate a FLDB 606B using the FLDB 606A and a subset 602B. Once FLDB 606B is generated, the folding operations 604 may generate a FLDB 606C from the FLDB 606B and a subset 602C. The folding operations 604 may continue until there remains a final FLDB, such as FLDB 606N, for example.

Once the folding operations 604 generate a final FLDB such as FLDB 606N, the circuitry 118 may perform a single reduction operation 610 on the FLDB 606N to calculate a final CRC/residue 612. Performing a single reduction operation 610 for a final FLDB 606N is less computationally expensive relative to calculating a CRC value for each subset 602A . . . 602N.

Additionally or alternatively, a single reduction operation 610 may be performed on a final FLDB and/or any remaining data 608 from the uncompressed data 122 that was not involved in the one or more folding operations 604, to produce a final CRC/residue 612.

By way of example, subsets 602A . . . 602N of a relatively larger size (e.g., 16 bytes or larger in size) may be processed in and/or as a result of execution by host processor 12 of multiple instances (and/or threads comprising multiple instances) of a special carry-less multiplication instruction (e.g., PCLMULQDQ instruction 164 of the aforesaid microprocessor) in folding operations 604 to produce multiple blocks 606A . . . 606N based upon these subsets 602A . . . 602N. For improved processing efficiency, these instances and/or threads may be executed concurrently and/or in parallel with the copying of the subsets 602A . . . 602N into the single buffer 506 for use in the reference comparison operations previously described. After all of the uncompressed data 122 has been processed to produce the compressed stream 128 or at least has been copied into the single buffer 506, a final FLDB 606N may undergo a single reduction operation 610 to produce the final CRC/residue 612. Advantageously, these features of this embodiment may permit CRC calculations to be performed more efficiently and with less latency than in conventional techniques. Further advantageously, the features of this embodiment may permit CRC calculations to be accurately and efficiently made in the situation in which the final CRC value may be based upon a buffer that may comprise of multiple concatenated buffer segments/portions.

More particularly, host processor 12 may execute, in parallel, multiple threads comprising and/or instances of PCLMULQDQ instruction 164 in folding operations 604 that may result in the multi-byte subsets 602A . . . 606N being processed, as respective 4 dquadword input values, by such instances, thereby permitting 64-byte input values to be so processed. This may result, at least in part, in host processor 12 generating multiple respective blocks 606A . . . 606N from these subsets 602A . . . 602N. These folding operations 604 may comprise folding and/or other techniques such as those described in, for example, Gopal et al., "Fast CRC Computation For Generic Polynomials Using PCLMULQDQ Instruction," Intel Corporation, copyright 2009. Of course, many other and/or additional techniques may be employed without departing from this embodiment.

It may be appreciated that although FIG. 6 illustrates subsets 602A . . . 602N as disjoint contiguous portions of an input buffer, the subsets 602A . . . 602N may be implemented as disjoint non-contiguous portions of the input buffer. Further, although FIG. 6 graphically illustrates subsets 602A . . . 602N and the blocks 606A . . . 606N as a same or similar sizes, it may be appreciated that the subsets 602A . . . 602N (or a buffer storing subsets 602A . . . 602N) and the blocks 606A . . . 606N may be of different sizes. For instance, a block 606A may comprise 16 bytes, whereas a typical buffer size storing subsets 602A . . . 602N may vary from 1-64 kilobytes.

FIG. 7 illustrates one embodiment of additional compression-related operations performed by the circuitry 118. Circuitry 118 may be capable of performing multiple loop iterations 710A . . . 710M of a main program loop. During each of the loop iterations 710A . . . 710M, a respective subset 706A . . . 706Z of variable-size tokens 702A . . . 702N of the compressed data stream 128 may be accumulated in an accumulator 704. After each of the loop iterations 710A . . . 710M, the respective subset 706A . . . 706Z of the tokens 702A . . . 702N may be copied from the accumulator 704 into a memory 21 via one or more copy operations 708. After appropriate processing, the copied respective subset may be provided to the compressed data stream 128 in buffer 126 in memory 21 and/or into one or more packets 130. Examples of a token may include without limitation one or more symbols, characters, and/or values. Accumulator 704 may be implemented as one or more registers in host processor 12.

For example, in one compression technique, since at least some types of processors are better able to process data writes of certain sizes better than data writes of other sizes, variable-size tokens are accumulated into one of the processor's registers until the register reaches a predetermined fill threshold level that corresponds to one of the certain data sizes that the processor is better able to write. In contrast, in some embodiments, the execution of multiple loop iterations 710A . . . 710M by host processor 12 as part of one or more compression-related operations may result in respective tokens 702A . . . 702N and/or subsets 706A . . . 706Z of such tokens being generated by circuitry 118 and/or host processor 12. As each respective subset of tokens is generated by circuitry 118, host processor 12 may write the respective subset 706A of tokens into accumulator 704 in host processor 12. If any additional subsets of tokens are generated during the respective loop iteration, then they may be appended to the end of value that is currently stored in the accumulator 704. After or concurrently, with the termination of each of the respective iterations 710A . . . 710M, the one or more values in the accumulator 704 may be shifted in accumulator 704 by host processor 12 by a multiple of 8 bits, and the resulting shifted value may be written out to memory 21 by host processor 12. After being appropriately manipulated and/or otherwise processed by host processor 12 and/or circuitry 118 to de-shift and/or separate out the one or more respective subsets of tokens 706A, the resulting one or more respective subsets of tokens 706A may be appropriately combined by circuitry 118 with other subsets 706B . . . 706Z to form the tokens 702A . . . 702N in the compressed data stream 128. Advantageously, depending upon the particular operational characteristics of host processor 12, this may permit the resulting shifted value to be more easily written out to memory 21 by host processor 12. Also advantageously, these techniques in this embodiment may avoid branch mis-predicts and/or other issues that otherwise arise (e.g., in every 7-8 writes of the accumulator 704).

Returning now to the previous discussion made above in connection with comparison-related operations described with reference to FIG. 3, one possible sequence of program code instructions that may be advantageously used in this embodiment to implement at least certain comparison-related and/or other operations is set forth below:

```
xor tmp3, tmp3
loop1:
mov tmp, [src1+tmp3+8]
mov tmp2, [src1+tmp3]
lea result, [tmp3+8]
xor tmp, [src2+tmp3+8]
xor tmp2, [src2+tmp3]
cmovnz tmp, tmp2
cmovnz result, tmp3
test tmp, tmp
jnz miscompare
add tmp3, 16
cmp tmp3, 256
jb loop1
mov tmp+w, [src1+tmp3]
xor tmp+w, [src2+tmp3]
jnz miscompare16
mov result, 258
jmp end
miscompare16:
and tmp, 0xFFFF
mov result, tmp3
miscompare:
bsf tmp, tmp
shr tmp, 3
add result, tmp
```

Of course, the above sequence of program code instructions is merely exemplary. Many modifications, additions, variations, and alternatives are possible without departing from this embodiment.

In summary, circuitry 118 may be provided that is capable of performing compression-related operations such as: (a) indicating, at least in part, in a data structure at least one position of at least one subset of characters that are to be encoded as a symbol; (b) comparing, at least in part, at least one pair of multi-byte data words that are of identical predetermined fixed size; (c) maintaining, at least in part, an array of pointers to potentially matching strings that are to be compared with at least one currently examined string; and/or (d) allocating, at least in part, a first buffer portion to store at least one portion of uncompressed data from an application buffer that is to be input for compression to produce a compressed data stream. Circuitry 118 may also perform other compression-related operations as previously described.

Advantageously, the techniques of this embodiment may permit compression-related operations to be carried out in a manner that is more efficient and faster, without substantially sacrificing resulting compression ratio. Indeed, it has been found that for at least some applications, depending upon the particulars of the implementation of this embodiment, it may be possible for an implementation of this embodiment to produce compressed output data several (e.g., about 4.5) times faster than may be the case using a conventional technique, while about 5 percent of the compression ratio may be sacrificed. Further advantageously, the techniques of this embodiment may be used in producing compressed data that may be compatible with Deflate and/or Gzip.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment.

Furthermore, in the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements.

In addition, the term "and/or" may mean "and," it may mean "or," it may mean "exclusive-or," it may mean "one," it may mean "some, but not all," it may mean "neither," and/or it may mean "both," although the scope of claimed subject matter is not limited in this respect. In the following description and/or claims, the terms "comprise" and "include," along with their derivatives, may be used and are intended as synonyms for each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the scope of the appended claims.

The invention claimed is:
1. An apparatus, comprising:
a memory to store multi-byte data words;
a circuitry for performing compression-related operations, the circuitry to:
  receive a first pair of multi-byte data words of the multi-byte data words comprising a first multi-byte data word and a second multi-byte data word, the first multi-byte data word and the second multi-byte data word having an identical fixed size;
compare the first multi-byte data word and the second multi-byte data word based on an exclusive-or (XOR) operation; and
determine whether a result of the XOR operation indicates an occurrence of a mis-compare.

2. The apparatus of claim 1, the circuitry to, in response to determining a mis-compare has occurred, determine a first location in one of the pair of multi-byte words at which the mis-compare occurs.

3. The apparatus of claim 2, the circuitry to perform one or more bit search forward (BSF) instructions to determine the first location in one of the first pair of multi-byte words.

4. The apparatus of claim 1, the circuitry to execute a single instruction to compare the first multi-byte data word and the second multi-byte data word based on the XOR operation.

5. The apparatus of claim 1, the circuitry to:
receive a second pair of multi-byte data words comprising a third multi-byte data word and a fourth multi-byte data word, the third multi-byte data word and the fourth multi-byte data word having an identical fixed size;
compare the third multi-byte data word and the fourth multi-byte data word based on a second XOR operation; and
determine whether a result of the second XOR operation indicates an occurrence of a second mis-compare.

6. The apparatus of claim 5, the circuitry to conduct the comparison of the first pair of multi-byte data words in parallel with the comparison of the second pair of multi-byte data words.

7. The apparatus of claim 5, the circuitry to:
utilize a first thread to compare the first multi-byte data word and the second multi-byte data word; and
utilize a second thread to compare the third multi-byte data word and the fourth multi-byte data word.

8. The apparatus of claim 7, comprising:
a host processor comprising the circuitry to utilize the first and second threads.

9. At least one non-transitory computer-readable storage medium comprising one or more instructions, that when executed, cause a circuitry to:
receive a first pair of multi-byte data words comprising a first multi-byte data word and a second multi-byte data word, the first multi-byte data word and the second multi-byte data word having an identical fixed size;
compare the first multi-byte data word and the second multi-byte data word based on an exclusive-or (XOR) operation; and
determine whether a result of the XOR operation indicates an occurrence of a mis-compare.

10. The at least one non-transitory computer-readable storage medium of claim 9, comprising one or more instructions, that when executed, cause the circuitry to, in response to determining a mis-compare has occurred, determine a first location in one of the pair of multi-byte words at which the mis-compare occurs.

11. The at least one non-transitory computer-readable storage medium of claim 10, comprising one or more instructions, that when executed, cause the circuitry to, perform one or more bit search forward (BSF) instructions to determine the first location in one of the first pair of multi-byte words.

12. The at least one non-transitory computer-readable storage medium of claim 9, comprising one or more instructions, that when executed, cause the circuitry to execute a single instruction to compare the first multi-byte data word and the second multi-byte data word based on the XOR operation.

13. The at least one non-transitory computer-readable storage medium of claim 9, comprising one or more instructions, that when executed, cause the circuitry to:
receive a second pair of multi-byte data words comprising a third multi-byte data word and a fourth multi-byte data word, the third multi-byte data word and the fourth multi-byte data word having an identical fixed size;
compare the third multi-byte data word and the fourth multi-byte data word based on a second XOR operation; and
determine when a second mis-compare occurs as a result of the second XOR operation.

14. The at least one non-transitory computer-readable storage medium of claim 13, comprising one or more instructions, that when executed, cause the circuitry to conduct the comparison of the first pair of multi-byte data words in parallel with the comparison of the second pair of multi-byte data words.

15. The at least one non-transitory computer-readable storage medium of claim 13, comprising one or more instructions, that when executed, cause the circuitry to:
utilize a first thread to compare the first multi-byte data word and the second multi-byte data word; and
utilize a second thread to compare the third multi-byte data word and the fourth multi-byte data word.

16. The at least one non-transitory computer-readable storage medium of claim 15, comprising one or more instructions, that when executed, cause the circuitry to:
utilize the first thread on a first microprocessor of a host processor; and
utilize the second thread on a second microprocessor of the host processor.

17. A computer-implemented method, comprising:
receiving a first pair of multi-byte data words comprising a first multi-byte data word and a second multi-byte data word, the first multi-byte data word and the second multi-byte data word having an identical fixed size;
comparing the first multi-byte data word and the second multi-byte data word based on an exclusive-or (XOR) operation; and
determining whether a result of the XOR operation indicates an occurrence of a mis-compare.

18. The computer-implemented method of claim 17, comprising, in response to determining a mis-compare has occurred, determining a first location in one of the pair of multi-byte words at which the mis-compare occurs.

19. The computer-implemented method of claim 18, comprising performing one or more bit search forward (BSF) instructions to determine the first location in one of the first pair of multi-byte words.

20. The computer-implemented method of claim 17, comprising executing a single instruction to compare the first multi-byte data word and the second multi-byte data word based on the XOR operation.

21. The computer-implemented method of claim 17, comprising:
receiving a second pair of multi-byte data words comprising a third multi-byte data word and a fourth multi-byte data word, the third multi-byte data word and the fourth multi-byte data word having an identical fixed size;
comparing the third multi-byte data word and the fourth multi-byte data word based on a second XOR operation; and determining whether a result of the second XOR operation indicates an occurrence of a second mis-compare.

22. The computer-implemented method of claim 21, comprising conducting the comparison of the first pair of multi-byte data words in parallel with the comparison of the second pair of multi-byte data words.

23. The computer-implemented method of claim 21, comprising:
   utilizing a first thread to compare the first multi-byte data word and the second multi-byte data word; and
   utilizing a second thread to compare the third multi-byte data word and the fourth multi-byte data word.

24. The computer-implemented method of claim 23, comprising
   utilizing the first thread on a first microprocessor of a host processor; and
   utilizing the second thread on a second microprocessor of the host processor.

* * * * *